United States Patent
Keller et al.

(10) Patent No.: US 10,600,929 B2
(45) Date of Patent: Mar. 24, 2020

(54) OPTICAL VOLTAGE SOURCE

(71) Applicant: AZUR SPACE Solar Power GmbH, Heilbronn (DE)

(72) Inventors: Gregor Keller, Heilbronn (DE); Daniel Fuhrmann, Heilbronn (DE)

(73) Assignee: Azur Space Solar Power GmbH, Heilbronn (DE)

(*) Notice: Subject to any disclaimer, the term of this patent is extended or adjusted under 35 U.S.C. 154(b) by 0 days.

(21) Appl. No.: 16/222,090

(22) Filed: Dec. 17, 2018

(65) Prior Publication Data

US 2019/0189825 A1 Jun. 20, 2019

(30) Foreign Application Priority Data

Dec. 15, 2017 (DE) .................. 10 2017 011 643

(51) Int. Cl.
*H01L 31/06* (2012.01)
*H01L 31/068* (2012.01)
(Continued)

(52) U.S. Cl.
CPC .......... *H01L 31/068* (2013.01); *H01L 27/16* (2013.01); *H01L 31/02019* (2013.01);
(Continued)

(58) Field of Classification Search
CPC ......... H01J 37/023; H01J 37/18; H01L 27/16; H01L 31/02019; H01L 31/0304;
(Continued)

(56) References Cited

U.S. PATENT DOCUMENTS 4,127,862 A * 11/1978 Ilegems ............... G02B 6/4202
136/249
4,250,516 A * 2/1981 Worlock ............. H01L 31/1075
257/185
(Continued)

FOREIGN PATENT DOCUMENTS

CN 201393213 Y 1/2010
DE 19802402 A1 2/1999
(Continued)

OTHER PUBLICATIONS

Arthur Christoph Poloczek, $1^{st}$ ed., 2011 dissertation "Gestapelte PIN-Dioden und Resonanztunneldioden in optoelektronischen Empfaengerschaltungen hoher Funktionsdichte/Stacked PIN diodes and resonant tunneling diodes in optoelectronic receiver circuits with high functional density".

(Continued)

*Primary Examiner* — Mohammed Shamsuzzaman
(74) *Attorney, Agent, or Firm* — Muncy, Geissler, Olds & Lowe, P.C.

(57) ABSTRACT

An optical voltage source and decoupling device is provided, wherein the optical voltage source has a number N of series-connected semiconductor diodes, each having a p-n junction, the semiconductor diodes are monolithically integrated and together form a first stack with an upper side and an underside, and the number N of the semiconductor diodes of the first stack is greater than or equal to two, the decoupling device has a further semiconductor diode. The further semiconductor diode has a pin junction and, the further semiconductor diode is anti-serially connected with the semiconductor diodes of the first stack. An underside of the further semiconductor diode is materially connected with the upper side of the first stack and the further semiconductor diode forms a total stack together with the first stack.

20 Claims, 1 Drawing Sheet

(51) Int. Cl.
*H01L 31/0304* (2006.01)
*H01L 31/0693* (2012.01)
*H01L 31/0687* (2012.01)
*H01L 31/02* (2006.01)
*H01L 31/167* (2006.01)
*H01L 27/16* (2006.01)
*H01L 31/12* (2006.01)
*H01L 31/173* (2006.01)

(52) U.S. Cl.
CPC ...... *H01L 31/0304* (2013.01); *H01L 31/0687* (2013.01); *H01L 31/0693* (2013.01); *H01L 31/125* (2013.01); *H01L 31/167* (2013.01); *H01L 31/173* (2013.01)

(58) Field of Classification Search
CPC ............... H01L 31/068; H01L 31/0687; H01L 31/0693; H01L 31/125; H01L 31/167; H01L 31/173
See application file for complete search history.

(56) References Cited

U.S. PATENT DOCUMENTS

| | | | | |
|---|---|---|---|---|
| 4,368,385 A | * | 1/1983 | Kanbe | H01L 31/11 250/551 |
| 5,401,953 A | * | 3/1995 | Spencer | G02B 6/4295 250/208.4 |
| 5,594,237 A | * | 1/1997 | Kulick | H01L 31/105 250/214.1 |
| 6,013,935 A | | 1/2000 | Shie | |
| 6,154,475 A | * | 11/2000 | Soref | B82Y 20/00 257/18 |
| 6,453,105 B1 | * | 9/2002 | Johnson | G02B 6/12004 385/129 |
| 6,879,014 B2 | * | 4/2005 | Wagner | H01L 31/03682 257/434 |
| 6,999,670 B1 | * | 2/2006 | Gunn, III | G02F 1/025 385/131 |
| 7,812,249 B2 | * | 10/2010 | King | H01L 31/036 136/255 |
| 8,742,251 B2 | | 6/2014 | Werthen et al. | |
| 8,828,769 B2 | * | 9/2014 | Quick | H01L 21/4846 438/48 |
| 9,557,585 B1 | * | 1/2017 | Yap | G02F 1/025 |
| 9,673,343 B2 | * | 6/2017 | Fafard | H01L 31/0304 |
| 9,741,874 B2 | * | 8/2017 | Fuhrmann | H01L 29/88 |
| 9,806,112 B1 | * | 10/2017 | Celo | H01L 27/1443 |
| 10,361,330 B2 | * | 7/2019 | Derkacs | |
| 10,388,817 B2 | * | 8/2019 | Fafard | |
| 10,403,778 B2 | * | 9/2019 | Derkacs | |
| 2003/0141518 A1 | * | 7/2003 | Yokogawa | H01L 21/8252 257/194 |
| 2003/0173561 A1 | * | 9/2003 | Sieben | H01L 31/173 257/21 |
| 2005/0018331 A1 | * | 1/2005 | Pautet | G01J 3/26 359/885 |
| 2006/0159383 A1 | * | 7/2006 | Jones | G02F 1/025 385/1 |
| 2008/0267237 A1 | * | 10/2008 | Hall | C03C 13/048 372/45.01 |
| 2011/0108081 A1 | | 5/2011 | Werthen et al. | |
| 2012/0007102 A1 | * | 1/2012 | Feezell | H01L 27/156 257/76 |
| 2012/0313201 A1 | * | 12/2012 | Hebert | G02B 5/285 257/432 |
| 2016/0308085 A1 | * | 10/2016 | Guter | H01L 25/167 |
| 2016/0343704 A1 | * | 11/2016 | Fuhrmann | H01L 23/3171 |
| 2016/0365470 A1 | * | 12/2016 | Guter | H01L 31/03046 |
| 2017/0084757 A1 | * | 3/2017 | Fuhrmann | H01L 29/88 |
| 2018/0019269 A1 | * | 1/2018 | Klipstein | H01L 27/1443 |
| 2018/0241478 A1 | * | 8/2018 | Guter | H01L 31/02019 |
| 2019/0058074 A1 | * | 2/2019 | Fuhrmann | H01L 27/0629 |

FOREIGN PATENT DOCUMENTS

| | | | |
|---|---|---|---|
| DE | 10011258 A1 | 9/2001 | |
| EP | 1936700 A2 | 6/2008 | |
| EP | 2983213 A1 | 2/2016 | |
| EP | 3324451 A1 * | 5/2018 | ........... H01L 21/308 |

OTHER PUBLICATIONS

German Search Report for German Application No. 10 2017 011 643.1 dated Sep. 5, 2018 with English translation.
Ishigaki et al, "A new optically-isolated power vonverter for 12V gate drive power supplies applied to high voltage and high speed switching devices." 2017 IEEE Applied Power Electronics Conference and Exposition (APEC), IEEE, Mar. 26, 2017, pp. 2312-2316.
Emelyanov et al, "Photovoltaic optical sensors for high-power conversion and information transmission", Proc. of Spie, vol. 10231, May 16, 2017 p. 102311B ISBN 978-1-5106-1533-5.

* cited by examiner

OPTICAL VOLTAGE SOURCE

This nonprovisional application claims priority under 35 U.S.C. § 119(a) to German Patent Application No. 10 2017 011 643.1, which was filed in Germany on Dec. 15, 2017, and which is herein incorporated by reference.

BACKGROUND OF THE INVENTION

Field of the Invention

The present invention relates to an optical voltage source.

Description of the Background Art

To supply sensors in exposed environments, e.g., due to high voltage or risk of explosion, it is known to optically transmit the energy and to convert it, for example, into electrical energy with a photovoltaic converter. For this purpose, optical voltage sources with a very high output voltage are required, for example a high-voltage diode, as is known from EP 2 983 213 A1, which is incorporated herein by reference.

The dissertation "Gestapelte PIN-Dioden and Resonanztunneldioden in optoelektronischen Empfängerschaltungen hoher Funktionsdichte" ("Stacked PIN diodes and resonant tunneling diodes in optoelectronic receiver circuits with high functional density" by Arthur Christoph Poloczek, 1st ed., 2011), discloses an optoelectronic receiver circuit with high functional density.

Optical voltage sources are also known from DE 198 02 402, DE 100 11 258, and US 2003/0173561, which are all herein incorporated by reference.

SUMMARY OF THE INVENTION

It is therefore an object of the present invention to provide a device which further develops the state of the art.

In an exemplary embodiment, an optical voltage source and a decoupling device are provided.

The optical voltage source has a number N of semiconductor diodes connected in series, each having a p-n junction, wherein the semiconductor diodes are monolithically integrated and together form a first stack with an upper side and an underside.

The number N of the semiconductor diodes of the first stack is greater than or equal to two.

The decoupling device has a further semiconductor diode, wherein the further semiconductor diode comprises a p-i-n junction.

The further semiconductor diode is antiserially connected with the semiconductor diodes of the first stack, wherein an underside of the further semiconductor diode is materially connected to the upper side of the first stack, and the further semiconductor diode together with the first stack forms a common semiconductor diode.

It should be noted that together, the diodes of the first stack form a so-called multi-junction photodiode or a high-voltage diode and represent the optical voltage source.

Thus, an optical, galvanically isolated power supply is provided. The semiconductor diodes of the first stack and/or the further semiconductor diode preferably are formed of a III-V semiconductor, particularly preferably GaAs.

In particular, III-V semiconductors such as GaAs very efficiently convert light with a suitable wavelength into electrical energy.

The other diode is also called a PIN diode or a high-speed photodiode. It should be noted that the further diode is formed of a plurality of stacked semiconductor layers and forms a second stack. The first stack and the second stack can be monolithically integrated.

By means of antiserially connecting the further diode with the semiconductor diodes of the first stack, the further diode is biased with a source voltage of the first stack or the optical voltage source in the locking direction or backward direction.

By means of the negative preload, that is, the negative bias, the capacitance of the further semiconductor diode is minimized so that the further diode has a particularly low capacitance at the operating point as compared to the first stack or the optical voltage source. This way, fast data transmission or a fast switching of the photo diode is made possible Data signals are modulated onto the optical signal for the power transmission. Alternatively, data signals are transmitted by means of a specific wavelength, wherein the specific wavelength for the data transmission differs from all the wavelengths used for the power transmission.

Thus, according to the invention, a high-voltage diode, an efficient and galvanically isolated energy supplier, is combined with a high-speed power diode for data transmission, e.g., of control signals.

An advantage of the combination according to the invention is therefore, that in addition to a galvanically isolated power transmission, the overall device enables high-speed data transmission.

In a projection perpendicular to the upper side of the first stack, the further semiconductor diode covers at most 50% or at most 30% or at most 10% of the upper side of the first stack.

The further semiconductor diode has a capacitance of no more than 10 pF. Here, the capacitance value refers to an operating voltage. Preferably, the operating voltage is within a range between 1 volt and 10 volts, most preferably in a range between 2 volts and 5 volts.

The semiconductor diodes and the further semiconductor diode can be monolithically integrated.

A first contact, for example as a contact surface, is disposed on the upper side of the first stack and at a distance from the other diode. Preferably, the first contact is electrically conductively connected with a cathode of the further semiconductor diode, and with a cathode of the semiconductor diode, which adjoins the upper side of the first stack.

According to an embodiment, a second contact, e.g., a contact surface, is arranged on an upper side of the further diode.

In an embodiment, a third contact, e.g., a contact surface, is arranged on an underside of the first stack or the underside of the first stack is cohesively connected with an upper side of a carrier substrate, and a third contact, e.g., a contact surface, is disposed on the underside of the carrier substrate.

The total stack comprises a carrier substrate, wherein the underside of the first stack is cohesively connected with the upper side of the carrier substrate or with a conductive intermediate layer completely covering the upper side of the carrier substrate.

In a projection perpendicular to the upper side of the first stack, the carrier substrate preferably forms a peripheral edge around the first stack. Expressed differently, the peripheral edge forms a step with a step surface. In a further development, a third contact surface is arranged on the peripheral edge of the carrier substrate or on the step surface.

A whole-surface contact layer is preferably formed on the underside of the carrier substrate as a third contact surface. In a further development, the third contact surface is electrically conductively connected with an anode of the semiconductor diode, which adjoins the underside of the first stack.

In another development, a tunnel diode is formed between in each case two consecutive semiconductor diodes of the first sub-stack.

In one embodiment, at least two semiconductor diodes (D1, D2, DN) of the first stack (ST1) have an identical sequence of semiconductor layers, wherein the respective mutually corresponding layers of the two semiconductor diodes (D1, D2, DN) have an identical stoichiometry.

In a further development, the further semiconductor diode (Dpin) has a sequence of semiconductor layers arranged in a stacked manner, wherein the sequence is identical or not identical to the sequence of the semiconductor layers of one of the semiconductor diodes (D1, D2, DN) of the first stack. Preferably, in respect of identity, the layers of the two mutually corresponding semiconductor diodes (D1, D2, DN, DPIN) have an identical stoichiometry.

In a further development, the further diode has a cutoff frequency above 250 kHz. Preferably, the cutoff frequency is in a range between 1 MHz and 1 GHz; most preferably, the cutoff frequency is in a range between 2 MHz and 100 MHz Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
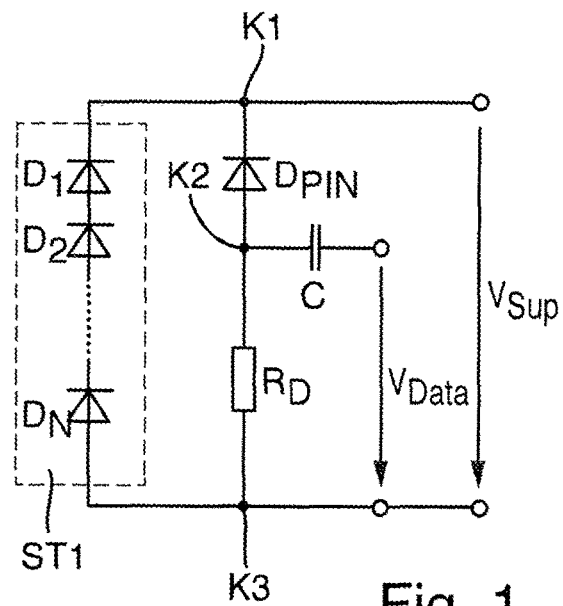
FIG. 1 is a circuit diagram of a first embodiment according to the invention of an optical voltage source and a decoupling device.

FIG. 1 schematically shows a circuit diagram of a first embodiment of an optical voltage source and a decoupling device.

The optical voltage source comprises a number N of series-connected semiconductor diodes D1, D2 to DN. The semiconductor diodes D1, D2, and DN form a first stack ST1. A second stack ST2 is arranged on the first stack ST1. The second stack ST2 comprises a further semiconductor diode DPIN. Preferably, the first stack ST1 and the second stack ST2 are monolithically integrated.

The decoupling device comprises the further semiconductor diode DPIN and an RC element formed of a resistor $R_D$ and a capacitor C for picking up a data signal Vdata. The further semiconductor diode DPIN is anti-serially connected to the semiconductor diodes D1, D2 to DN by means of a first electrical contact K1, that is, the cathode of the further semiconductor diode and the cathode of the uppermost semiconductor diode D1 of the first stack ST1 are electrically conductively connected with the first contact point K1.

The anode of the lowermost semiconductor diode DN of the first stack ST1 is electrically conductively connected with a third electrical contact K3. The anode of the further semiconductor diode Dpin is electrically conductively connected with the third contact K3 by means of a second electrical contact K2 and the resistor $R_D$, whereby the further semiconductor diode Dpin is biased in the reverse direction by a source voltage Vsup of the optical voltage source.

Via a capacitor C, a data signal Vdata is tapped off at the second contact K2, opposite the third contact K3.

Figure 2:
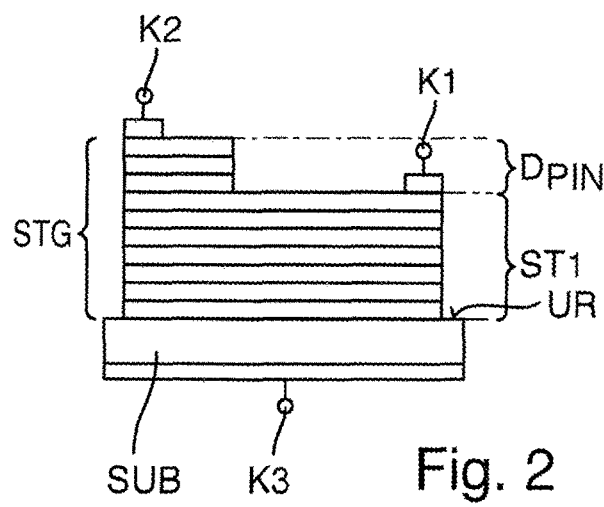
FIG. 2 is a schematic sectional view of a first embodiment according to the invention of the voltage source and parts of the decoupling device in FIG. 1.
Figure 3:
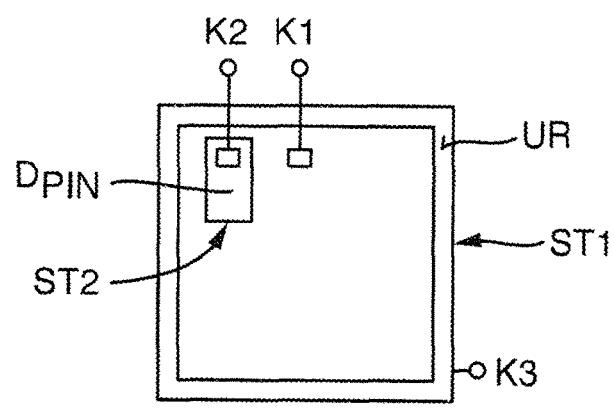
FIG. 3 is a schematic plan view of the embodiment in FIG. 2.

In the illustration of FIG. 2, a first embodiment of the optical voltage source is shown with parts of the decoupling device as an integrated component. The illustration of FIG. 3 shows a plan view of the integrated component according to the embodiment of FIG. 2. In the following, only the differences from the illustration of FIG. 1 will be explained.

The N series-connected semiconductor diodes D1, D2 to DN form a first stack ST1. On an upper side of the first stack ST1, the further diode Dpin and a contact surface as first contact K1 are arranged at a distance from one another. An underside of the further diode Dpin is cohesively connected with the upper side of the first stack ST1 and together with the first stack ST1 forms a total stack STG. A second contact surface K2 is arranged on an upper side of the further diode Dpin.

An underside of the first stack ST1 is cohesively connected with the upper side of a carrier substrate SUB as another layer of the total stack STG, wherein in a projection perpendicular to the upper side of the first stack, the carrier substrate SUB forms a peripheral edge UR around the first stack ST1. As the third contact K3, a conductive coating covers an underside of the carrier substrate SUB.

Other components, such as the RC element from FIG. 1, are realized externally according to this embodiment.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. An optical voltage source and a decoupling device comprising:
   a plurality of N series-connected semiconductor diodes, each of the plurality of N series-connected semiconductor diodes having a p-n junction, the semiconductor diodes being monolithically integrated;
   the optical voltage source comprising a first stack formed by the plurality of N series-connected semiconductor diodes, the first stack having an upper side and an underside, wherein a number of N semiconductor diodes of the first stack is greater than or equal to two; and
   the decoupling device comprising a second stack with a further semiconductor diode having a p-i-n junction, the second stack having an upper side and an underside, the further semiconductor diode being anti-serially connected with the semiconductor diodes of the first stack via a resistor such that a cathode of the further semiconductor diode is electrically conductively connected with a cathode of an uppermost diode of the first stack, and comprising a capacitor electrically conductively connected such that the decoupling device is configured to pick up a data signal, wherein the underside of the further semiconductor diode is materially connected with the upper side of the first stack, and wherein the second stack with the further semiconductor diode forms a total stack together with the first stack.

2. The optical voltage source and decoupling device according to claim 1, wherein, in a projection perpendicular to the upper side of the first stack, the further semiconductor diode covers at most 50% or at most 30% or at most 10% of the upper side of the first stack.

3. The optical voltage source and decoupling device according to claim 1, wherein a capacitance of the further semiconductor diode does not exceed 10 pF.

4. The optical voltage source and decoupling device according to claim 1, wherein the semiconductor diodes and the further semiconductor diode are monolithically integrated.

5. The optical voltage source and decoupling device according to claim 1, wherein a first contact is arranged on the upper side of the first stack at a distance to the further semiconductor diode.

6. The optical voltage source and decoupling device according to claim 5, wherein the first contact is electrically conductively connected with the cathode of the further semiconductor diode and with the cathode of the semiconductor diode, which adjoins the upper side of the first stack.

7. The optical voltage source and decoupling device according to claim 1, wherein a second contact is arranged on the upper side of the further semiconductor diode.

8. The optical voltage source and decoupling device according to claim 1, wherein a third contact surface is arranged on the underside of the first stack, or wherein the underside of the first stack is cohesively connected with an upper side of a carrier substrate and the third contact is arranged on an underside of the carrier substrate.

9. The optical voltage source and decoupling device according to claim 1, wherein the total stack comprises a carrier substrate, and wherein the underside of the first stack is materially connected with an upper side of the carrier substrate or with a conductive intermediate layer which completely overlaps the upper side of the carrier substrate.

10. The optical voltage source and decoupling device according to claim 9, wherein, in a projection perpendicular to the upper side of the first stack, the carrier substrate forms a peripheral edge around the first stack.

11. The optical voltage source and decoupling device according to claim 10, wherein a third contact is arranged on the peripheral edge of the carrier substrate.

12. The optical voltage source and decoupling device according to claim 8, wherein the third contact is electrically conductively connected with an anode of a lowermost semiconductor diode, which adjoins the underside of the first stack.

13. The optical voltage source and decoupling device according to claim 1, wherein the semiconductor diodes of the first stack and/or the further semiconductor diode comprise a III-V semiconductor material or consist of a III-V semiconductor material.

14. The optical voltage source and decoupling device according to claim 13, wherein the III-V semiconductor material is GaAs.

15. The optical voltage source and decoupling device according to claim 1, wherein a tunnel diode is formed between in each case two successive semiconductor diodes of the first sub-stack.

16. The optical voltage source and decoupling device according to claim 1, wherein at least two semiconductor diodes of a first stack have an identical sequence of semiconductor layers, and wherein the respective mutually corresponding layers of the at least two semiconductor diodes have an identical stoichiometry.

17. The optical voltage source and decoupling device according to claim 1, wherein the further semiconductor diode has a sequence of stacked semiconductor layers and the sequence is identical or not identical to the sequence of the semiconductor layers of one of the semiconductor diodes of the first stack.

18. The optical voltage source and decoupling device according to claim 1, wherein the further semiconductor diode has a cutoff frequency of 250 kHz or above.

19. The optical voltage source and decoupling device according to claim 1, further comprising:

a first contact arranged on the upper side of the first stack, the first contact being electrically conductively connected to a cathode of an uppermost semiconductor diode of the first stack and to a cathode of the further semiconductor diode of the second stack;

a second contact arranged on the upper side of the second stack, the second contact being electrically conductively connected to an anode of the further semiconductor diode of the second stack; and a third contact arranged below the underside of the first stack, the third contact being electrically conductively connected to an anode of a lowermost semiconductor diode of the first stack;

a wherein the resistor whose one end is electrically conductively connected to the second contact and whose other end is electrically conductively connected to the third contact such that the further semiconductor diode is reverse biased by a source voltage of the optical voltage source between the first contact and the third contact.

20. The optical voltage source and decoupling device according to claim 19, wherein the capacitor has one end electrically conductively connected to the second contact such that the decoupling device is configured to pick up the data signal between the second contact and the third contact.

* * * * *